United States Patent
Cho et al.

(10) Patent No.: US 7,283,077 B2
(45) Date of Patent: Oct. 16, 2007

(54) DIVIDE-ADD CIRCUIT AND HIGH-RESOLUTION DIGITAL-TO-ANALOG CONVERTER USING THE SAME

(75) Inventors: Gyu-Hyeong Cho, Gonju-si (KR); Sang-Kyung Kim, Daejeon (KR); Young-Suk Son, Hwasung-si (KR)

(73) Assignee: Korea Advanced Institute of Science and Technology (KR)

( * ) Notice: Subject to any disclaimer, the term of this patent is extended or adjusted under 35 U.S.C. 154(b) by 0 days.

(21) Appl. No.: 11/398,868

(22) Filed: Apr. 6, 2006

(65) Prior Publication Data

US 2006/0261998 A1  Nov. 23, 2006

(30) Foreign Application Priority Data

May 19, 2005  (KR)  .................... 10-2005-0041989

(51) Int. Cl.
*H03M 1/66* (2006.01)
(52) U.S. Cl. .................... 341/150; 341/144
(58) Field of Classification Search ......... 341/140–172
See application file for complete search history.

(56) References Cited

U.S. PATENT DOCUMENTS

| | | | | |
|---|---|---|---|---|
| 4,661,802 A | * | 4/1987 | Yukawa | 341/150 |
| 5,258,759 A | | 11/1993 | Cauwenberghs et al. | |
| 5,369,403 A | * | 11/1994 | Temes et al. | 341/143 |
| 6,191,779 B1 | * | 2/2001 | Taguchi et al. | 341/144 |
| 6,583,743 B2 | * | 6/2003 | Moussavi | 341/144 |
| 6,809,673 B2 | * | 10/2004 | Scanlan et al. | 341/144 |
| 6,873,278 B1 | * | 3/2005 | Ferguson et al. | 341/150 |
| 6,917,321 B1 | * | 7/2005 | Haurie et al. | 341/150 |
| 7,116,255 B2 | * | 10/2006 | Lee et al. | 341/144 |
| 2005/0052301 A1 | * | 3/2005 | Mills | 341/144 |
| 2006/0139195 A1 | * | 6/2006 | Casper et al. | 341/144 |

OTHER PUBLICATIONS

V.F. Dias, et al., "High-speed Digital-to-analog convertor using passive switched-capacitor algorithmic conversion", IEE Electronics Letters, Aug. 18, 1998, vol. 24, No. 17, pp. 1063-1064.

J.E. Franca and J. C. Vital, "Low-cost CMOS algorithmic digital-analog convertor for high-frequency applications," IEEE 1990 Custom Integrated Circuits Conference, pp. 6.7.1-6.7.4, 1990.

(Continued)

*Primary Examiner*—Lam T. Mai
(74) *Attorney, Agent, or Firm*—Bachman & LaPointe, P.C.

(57) ABSTRACT

Disclosed herein is a divide-add circuit and a high-resolution Digital-to-Analog Converter (DAC) using the same. The DAC includes a plurality of DAC units and one or more divide-add circuit units. The plurality of DAC units performs Digital-Analog (DA) conversion on two or more segmented codes, into which an input digital code is segmented. The one or more divide-add circuit units is configured to be each composed only of capacitors and switches and to generate a final DA conversion output for the entire input digital code based on the voltages of the DAC units. Accordingly, a high resolution of more than ten bits can be implemented.

19 Claims, 7 Drawing Sheets

OTHER PUBLICATIONS

H. Matsumoto and K. Watanabe, "Switched-capacitor algorithmic digital-to-analog convertors", IEEE Trans. on Circuits and System, vol. CAS-33, No. 7, Jul. 1986, pp. 721-724.

G. Cauwenberghs, "A micropower CMOS algorithmic A/D/A Converter", IEEE Trans. on Circuits and System-I. vol. 42, No. 11 Nov. 1995, pp. 913-919.

* cited by examiner

[Figure 1]
PRIOR ART
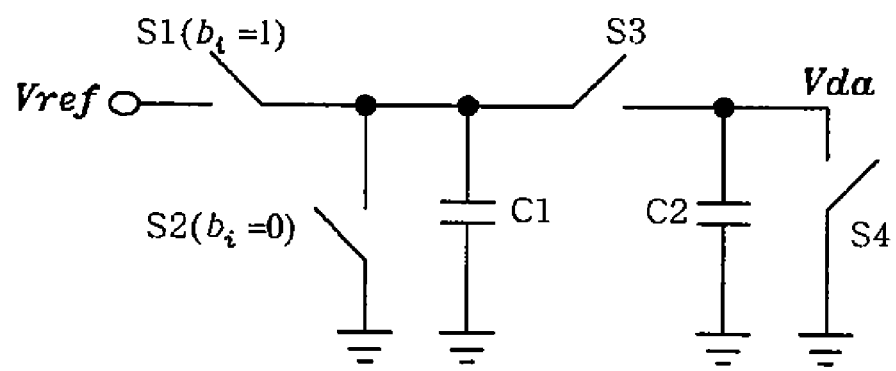

[Figure 2]
PRIOR ART
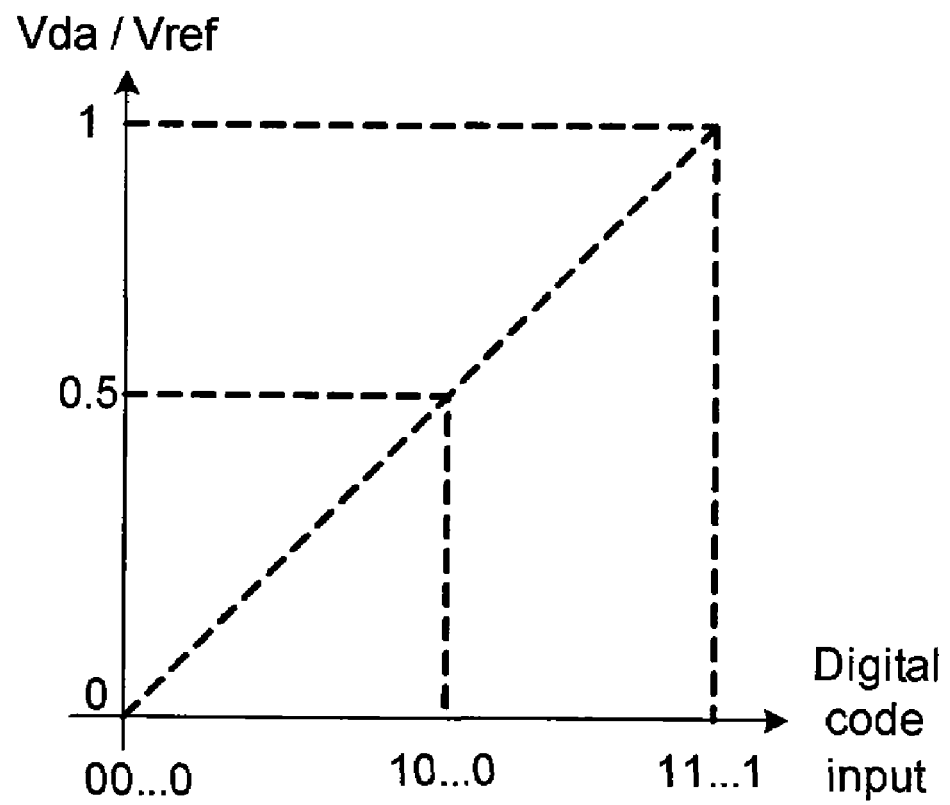

[Figure 3a]
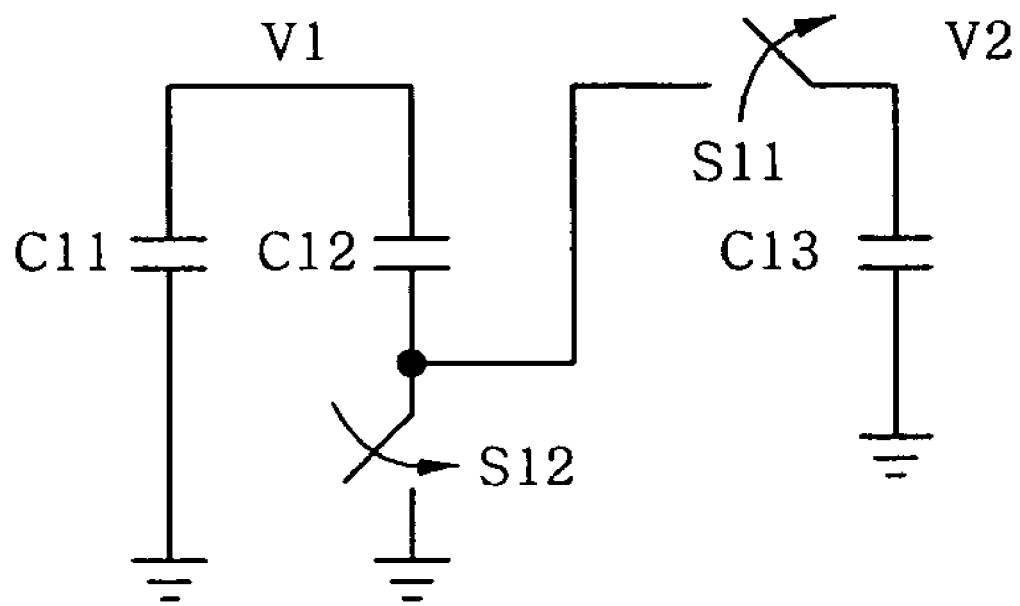

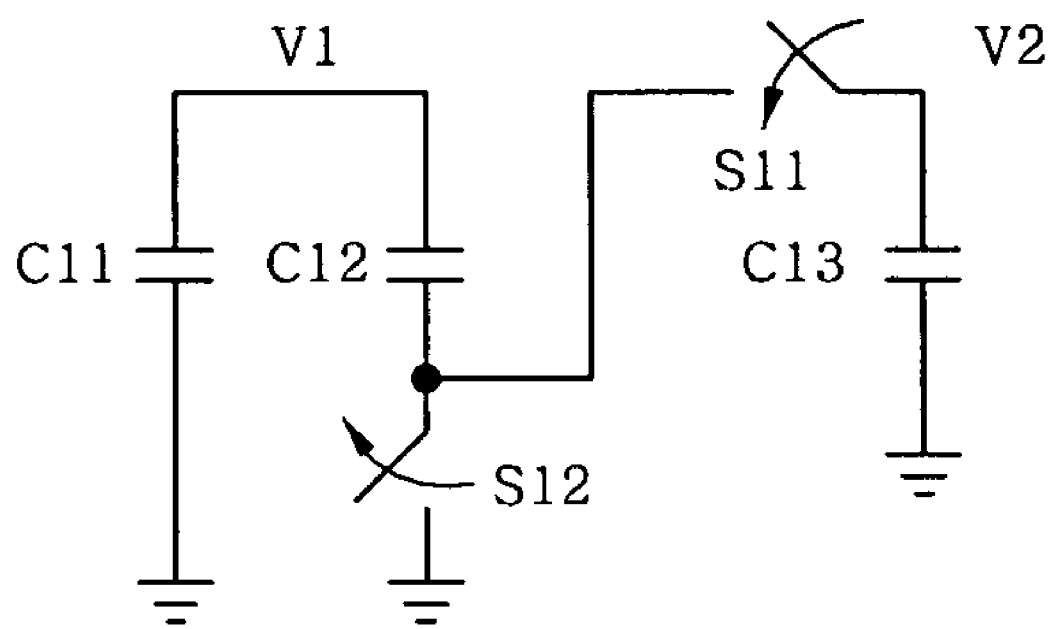
[Figure 3b]

[Figure 4]
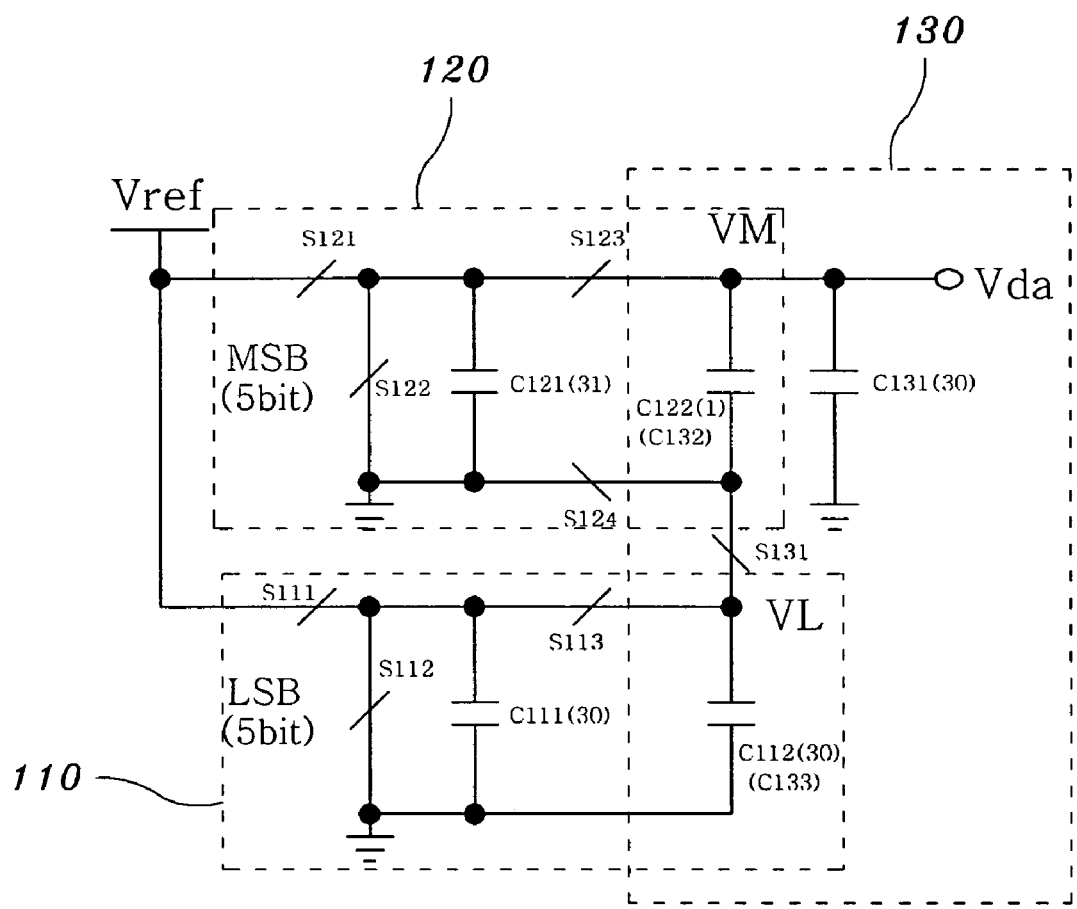

[Figure 5]
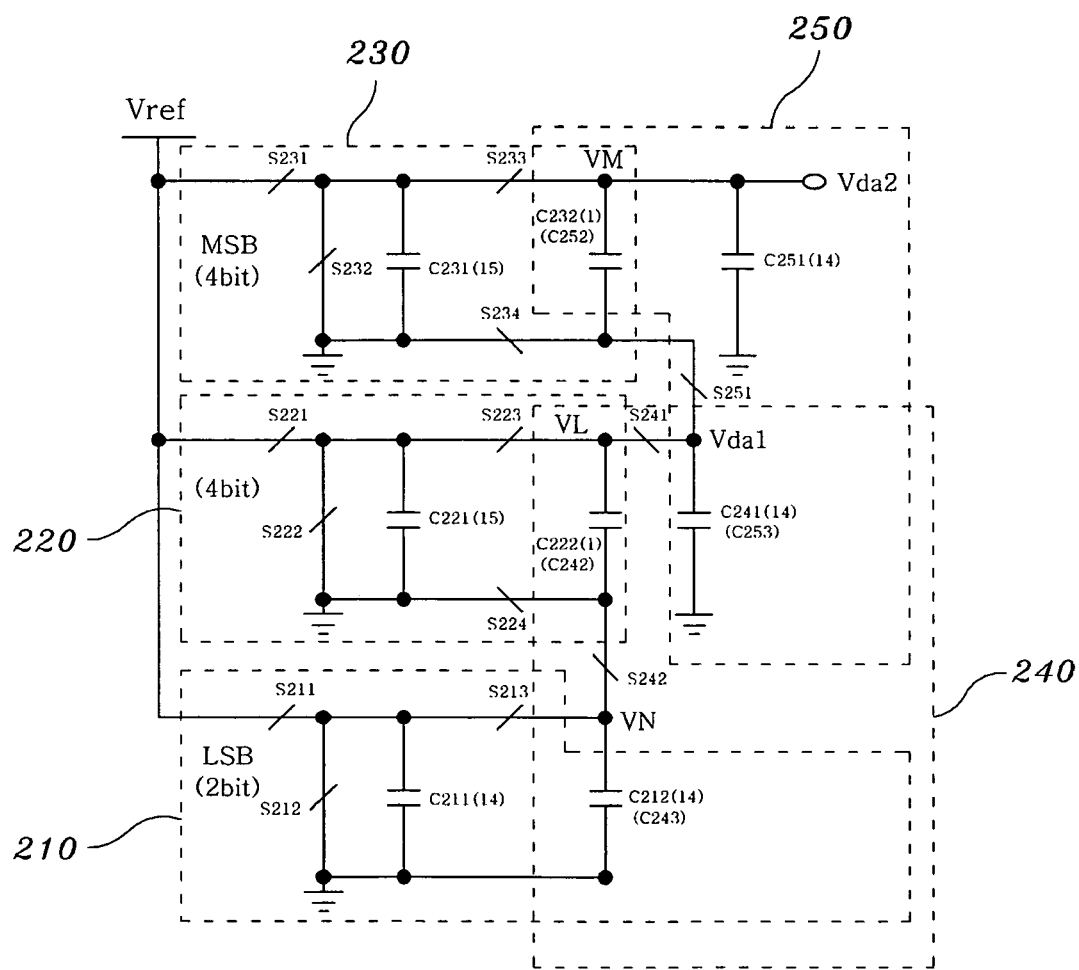

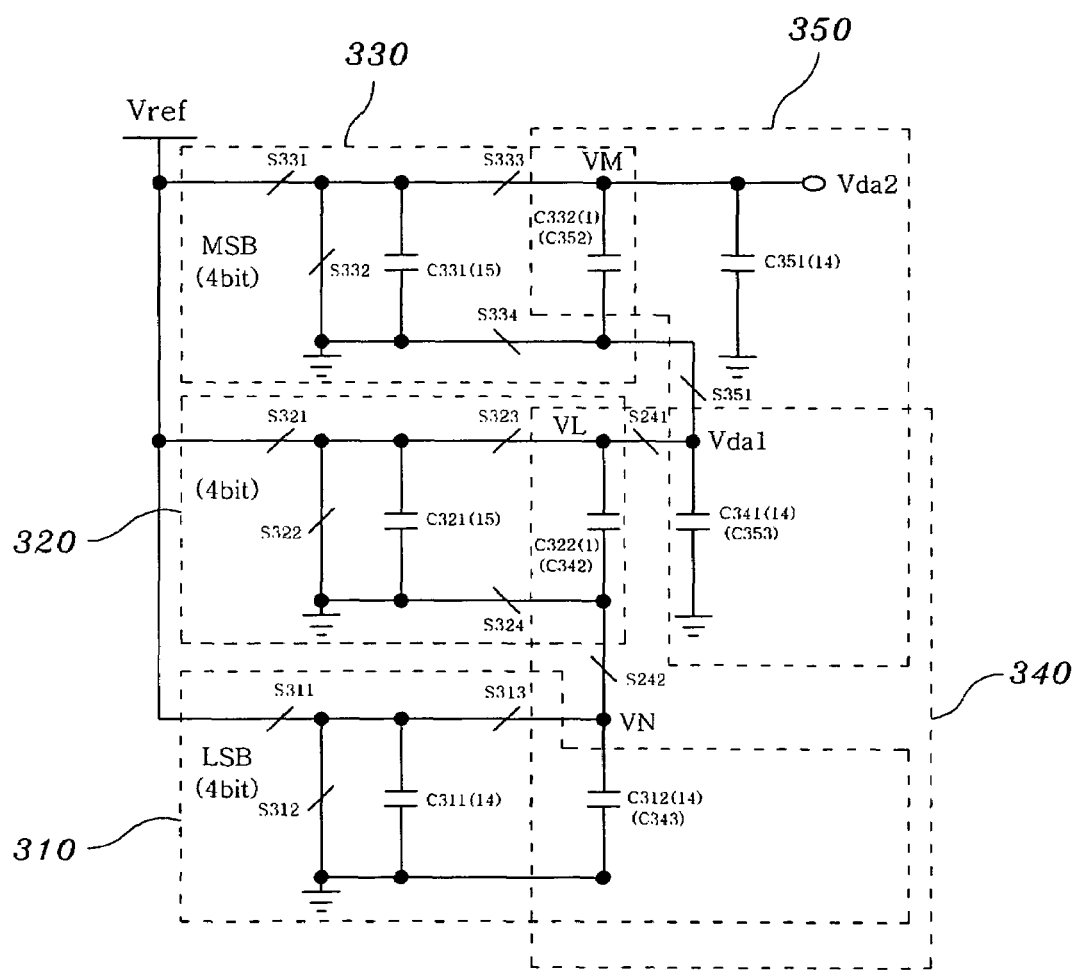
[Figure 6]

DIVIDE-ADD CIRCUIT AND HIGH-RESOLUTION DIGITAL-TO-ANALOG CONVERTER USING THE SAME

BACKGROUND OF THE INVENTION

1. Field of the Invention

The present invention relates generally to a divide-add circuit and a high-resolution digital-to-analog converter using the same and, more particularly, to a divide-add circuit, which is implemented using only capacitors and switches, and allows an input digital code to be divided into small-bit segments and then be processed at the time of converting a digital signal into an analog signal, thus being capable of implementing a high-resolution digital-to-analog converter, and a high-resolution digital-to-analog converter using the divide-add circuit.

2. Description of the Related Art

When a Digital-to-Analog Converter (hereinafter referred to as a "DAC") for converting digital signals to analog signals is implemented, performance criteria to be considered includes resolution, accuracy, power consumption, the area of circuitry, conversion speed, etc.

In order to improve the respective performance criteria, various types of DACs have been proposed. In the case where a DAC is necessary as part of a certain integrated system, it is especially important to reduce the area of circuitry and power consumption of the DAC.

A conventional DAC, having the lowest relative complexity, is illustrated in FIG. 1.

The DAC, which is called an algorithmic DAC or a cyclic DAC, includes two capacitors C1 and C2 having the same value, a plurality of switches S1 to S3 for controlling the charging and discharging of the capacitors C1 and C2, and a switch S4 for initializing circuitry.

In the conventional DAC, the switch S4 is turned on and causes an output voltage Vda to drop to 0 V, prior to the start of conversion.

Thereafter, the switch S1 or the switch S2 is turned on depending on the value of a charging and discharging control signal and the value of a digital signal desired to be converted. The switch S3 is turned on when the switches S1 and S2 are turned off, and the switch S1 or S2 is turned on when the switch S3 is turned off again. Such a process is repeatedly performed from the Least Significant Bit (LSB) of an input digital code to the Most Significant Bit (MSB) thereof.

That is, the switch S4 is turned on and the output voltage Vda is initialized. Thereafter, when the value "1" of the LSB of the input digital code is input, the switch S1 is turned on, and the switches S2 and S3 are in an OFF-state. In this case, the capacitor C1 is charged to an input voltage Vref.

Thereafter, when the switch S1 is turned off and the switch S3 is turned on, a part of charges, which have been stored in the capacitor C1, are stored in capacitor C2, so that the capacitors C1 and C2 are in a uniform state. That is, the switch S3 plays a role of averaging the voltages of the capacitors C1 and C2.

Thereafter, the switch S3 is turned off again, and the switches S1 and S2 are selectively turned on depending on the value of the input digital code. When the value of the input digital code is "0", the switch S2 is turned on and the switch S1 is in an OFF-state. In this case, the capacitor C1 is discharged to 0 V.

When the process is repeatedly performed to the MSB of the input digital code, the output voltage Vda is output as an analog voltage corresponding to the input digital code output (refer to FIG. 2)

One of the considerations at the time of design of the above-described DAC is the match between the two capacitors. An error occurs if the values of the two capacitors do not exactly coincide with each other. The error, which occurs due to the mismatch between the capacitors, is greatly affected by the accuracy of a process and, in particular, it is difficult to acquire an exact match between the capacitors in a case where an inexpensive digital process is used.

Furthermore, switching noise error, due to charge injection, occurs when the switches are turned off and charges that have been stored in the capacitors flow into neighboring nodes. Such error seriously affects the accuracy of the above-described DAC.

The conventional DAC described above, such as an algorithmic DAC or a cyclic DAC, is advantageous in that the area thereof is small, and the power consumption thereof is very low. However, the conventional DAC is problematic in that it is difficult to implement a high resolution of, more than eight bits using a recent low-voltage process due to various error factors.

SUMMARY OF THE INVENTION

Accordingly, the present invention has been made keeping in mind the above problems occurring in the prior art, and an object of the present invention is to provide a divide-add circuit and a high-resolution DAC using the same, which allow an input digital code to be segmented into two or more codes, performs conversion on the segmented small-bit codes using DAC units, and generates a total output using one or more divide-add circuit unit that is simply composed of capacitors and switches, so that a high resolution of more than ten bits can be implemented.

In order to accomplish the above object, the present invention provides a divide-add circuit, including a first capacitor configured to store charges depending on a first voltage across the first capacitor; a third capacitor configured to store charges depending on a second voltage across the third capacitor; a first path control switch connected to the third capacitor, and configured such that the first and third capacitors are connected in series to each other therethrough; and a second capacitor connected in parallel to the first capacitor with respect to the first voltage, and configured to be connected in series to the third capacitor though the first path control switch; wherein the value of voltage, which is obtained by dividing the second voltage at an appropriate ratio that is proportional to the ratio of the second and third capacitors, is added to the first voltage, prior to connection between the second and third capacitors; and wherein the value of the first voltage across the first capacitor is calculated by a division and addition operation in a state in which the second capacitor is connected in series to the third capacitor through the first path control switch and the first and third capacitors are connected in parallel to each other.

In addition, the present invention provides a high-resolution DAC using a divide-add circuit, including a plurality of DAC units for performing Digital-Analog (DA) conversion on two or more segmented codes, into which an input digital code is segmented; and one or more divide-add circuit units configured to be each composed only of capacitors and switches and to generate a final DA conversion output for the entire input digital code based on the voltages of the DAC units.

The one or more divide-add circuit units are a plurality of divide-add circuit units that adds the conversion results of the DAC units that perform DA conversion on the segmented codes, ranging from a segmented code including the Least Significant Bit (LSB) of the input digital code to a segmented code including the Most Significant Bit (MSB) of the input digital code, and obtains the DA conversion result of the entire input digital code.

BRIEF DESCRIPTION OF THE DRAWINGS

The above and other objects, features and advantages of the present invention will be more clearly understood from the following detailed description taken in conjunction with the accompanying drawings, in which:

FIG. 1 is a circuit diagram showing the construction of a conventional DAC;

FIG. 2 is a circuit diagram showing the output waveform of FIG. 1;

FIG. 3 is a circuit diagram showing the construction of a divide-add circuit according to the present invention;

FIG. 4 is a circuit diagram showing a high-resolution DAC using a divide-add circuit according to an embodiment of the present invention; and FIGS. 5 and 6 are circuit diagrams showing high-resolution DACs according to other embodiments of the present invention.

DESCRIPTION OF THE PREFERRED EMBODIMENTS

The present invention is described in detail with reference to the accompanying drawings below.

The embodiments of the present invention, which are described later, are illustrative but not restrictive.

FIG. 3 illustrates a divide-add circuit according to the present invention.

As shown in FIG. 3, the divide-add circuit of the present invention includes three capacitors C11 to C13, and switches S11 and S12 configured to control the connection paths of the capacitors C11 to C13 and to perform opposite operations.

The capacitors C11 and C12 are connected in parallel to each other so as to be charged with charges through first ends of the capacitor C11 due to the same voltage V1. The second end of the capacitor C11 is connected to ground and the second end of the capacitor C12 is connected to the ground through a path control switch S12.

One end of the capacitor 13 is connected to the ground, the other end thereof is connected in series to the capacitor C12 through the path control switch S11.

When the divide-add circuit of the present invention, which is constructed as described above, is in an initial state, the switch S12 is turned on and the switch S11 is turned off, as shown in FIG. 3A. Although not illustrated in FIG. 1, these switches S11 and S12 are switched in response to path control signals from the outside.

In the initial state, the capacitor C11 and C12 are charged to voltage V1, and the capacitor C13 is charged to voltage V2. Furthermore, the capacitors C12 and C13 are in a non-connection state.

Thereafter, as shown in FIG. 3B, when the switches S11 and switch S12 operate oppositely and, thereby, the switch S12 is turned off and the switch S11 is turned on, the capacitors C12 and C13 are connected in series to each other. Consequently, charges that have been stored in the capacitor C13 by voltage V2 move into the capacitor C11 and, thereby, the value of the stored voltage of the capacitor C11 increases to be greater than the value of the voltage V1. In this case, the capacitor C13 of FIG. 3 corresponds to the capacitor C2 of FIG. 1, and the DAC operation in FIG. 1 is terminated at the moment at which, after the MSB of the input digital code is input, the switch S3 is turned on and is then turned off again. That is, in FIG. 3B, the voltages V1 and V2 may be regarded as resulting voltages after the operation FIG. 1 is completed.

Meanwhile, an initial combined voltage obtained when the capacitors are connected in series to each other is equal to the sum of the voltages of the capacitors, and the reciprocal of a combined capacitance is equal to the sum of the reciprocals of the individual capacitances of the capacitors. A combined voltage obtained when the capacitors are connected in parallel to each other is equal to a value obtained by dividing the sum of charges, which are possessed by the individual capacitors, by a combined capacitance. The combined capacitance is equal to the sum of individual capacitances.

Accordingly, when the switch S12 is turned on and the switch S11 is turned off, the capacitors C11 and C12 are in a state in which they are connected in parallel to each other, so that the combined voltage of the capacitors C11 and C12 is equal to the value of voltage V1, and the combined capacitance thereof is equal to C11+C12 when the capacitances of the capacitors C11 and C12 are defined as C11 and C12, respectively.

Thereafter, when the switch S12 is turned off and the switch S11 is turned on, the capacitors C12 and C13 are in a state in which they are connected in series to each other and are connected in parallel with the capacitor C11, so that the combined capacitance of the capacitors C11, C12 and C13 is equal to C11+(C12C13/C12+C13).

Furthermore, a total charge can be obtained by (C11V1)+ (V1+V2)*(C12C13/(C12+C13)). Consequently, when the total charge is divided by a total combined capacitance, the charged voltage V1' of the capacitor C11 can be obtained by V1+(V2*C12C13/(C11C12+C12C13+C11C13)).

In this case, when C11=C13=m*C12, the charged voltage V1' of the capacitor C11 can be expressed as the following. Equation 1:

$$V1+V2/(m+2) \quad (1)$$

That is, a total voltage across the capacitor C11 can be expressed by adding the voltage V1 to a value, which is obtained by dividing the voltage V2 across the capacitor C13 by a value that is obtained by adding 2 to a certain number m that is proportional to a ratio of the capacitors C13 and C12.

This indicates that the divide-add circuit can be simply composed only of capacitors and switches.

A high-resolution DAC using a divide-add circuit that is composed only of capacitors and switches is described below.

FIG. 4 is a circuit diagram showing a high-resolution DAC using the divide-add circuit that is composed only of capacitors and switches, according to an embodiment of the present invention. The first embodiment achieves ten-bit DA conversion in such a manner that a ten-bit input digital code is segmented into two five-bit codes, the segmented codes are respectively converted into analog signals through DACs, each of which is the same as to that of FIG. 1, and the converted results are processed through the divide-add circuit of FIG. 3.

As shown in FIG. 4, the high-resolution DAC according to an embodiment of the present invention includes first and second DAC units 110 and 120 for respectively performing conversion on five bits corresponding to the LSB of an input digital code and five bits corresponding to the MSB of the input digital code, and outputting analog voltages, which correspond to respective input digital codes, based on an input voltage Vref, and a divide-add circuit unit 130 for adding the outputs of the first and second DAC units 110 and 120 and acquiring a converted output with respect to the entire input digital code.

The first and second DAC units 110 and 120 are connected in parallel to each other with respect to the input voltage Vref. In the same manner as the DAC of FIG. 1, the first DAC unit 110 is composed of two capacitors C111 and C112, and a plurality of switches S111 to S113 for controlling the charging and discharging of the capacitor C111 and C112, and the second DAC unit 120 is composed of two capacitors C121 and C122, and a plurality of switches S121 to S123 for controlling the charging and discharging of the capacitor C121 and C122.

In the same manner as the divide-add circuit of FIG. 3, the divide-add circuit unit 130 is composed of capacitors C131 and C132 connected in parallel to each other, and a capacitor C133 connected in series to the capacitor C132 through the switch S131. The switch S131 is turned off during a period in which the first and second DAC units 110 and 120 perform DA conversion, and is turned on during a period in which the divide-add circuit unit 130 performs a division-addition operation, so that a capacitor C132 and a capacitor C133 are configured to be in a state in which they are connected in series to each other.

A switch S124 is disposed on a signal line that connects the capacitors C121 and C122 of the second DAC unit 120 to a ground. Furthermore, the switch S124 is turned on during a period in which the second DAC 120 performs DA conversion, and is turned off during a period in which the divide-add circuit unit 130 performs a division-addition operation, so that the DA conversion operation of the second DAC 120 and the division-addition operation of the divide-add circuit unit 130 can be separated from each other.

Furthermore, in the present invention, although not illustrated in FIG. 4, a control unit is configured to segment the input digital code into two or more codes to be processed by the DAC units 110 and 120, and transfer the segmented codes to the corresponding DAC units 110 and 120.

In the above-described high-resolution DAC of the present invention, the five bits corresponding to the LSB of the input digital code are converted through the first DAC unit 110, and the five bits corresponding to the MSB of the input digital code are converted through the second DAC unit 120. In this case, the switch S124 is in an ON-state, and the switch S131 is in an OFF-state. Since the conversion operation of each of the first and second DAC units 110 and 120 is the same as that of the DAC of FIG. 1, detailed descriptions of them are omitted.

When the conversion of the five bits corresponding to the LSB of the input digital code and the conversion of the five bits corresponding to the MSB of the input digital code are completed by the first and second DAC units 110 and 120, the switch S124 is turned off, and the switch S131 is turned on, so that the divide-add circuit unit 130 operates.

When the converted voltage value of the five bits corresponding to the LSB, which is converted by the first DAC 110, is defined as VL and the converted voltage value of the five bit corresponding to the MSB, which is converted by the second DAC 110, is defined as VM, the overall output voltage Vda of the DAC units, which is obtained by the divide-add circuit unit 130, can be expressed as the following Equation 2, similar to Equation 1:

$$Vda = VM + VL/32 \quad (2)$$

The capacitor C131 of the divide-add circuit unit 130 corresponds to the capacitor C11 of the divide-add circuit of FIG. 3, the capacitor C132, which is an element of the second DAC unit 120 and, at the same time, an element of the divide-add circuit unit 130, corresponds to the capacitor C12 of FIG. 3, and the capacitor C133, which is an element of the first DAC 110 and, at the same time, an element of the divide-add circuit unit 130, corresponds to the capacitor C13 of FIG. 3, so that the combined capacitance of the capacitors C131, C132 and C133 is equal to C131+(C132C133/C132+C133), the final output voltage Vda is equal to VM+ (VL*C132C133/(C131C132+C132C133+C131C133)).

In this case, when C131=C133=m*C13 and the individual capacitors C131 to C133 have values (these values are numbers normalized using capacitors, each having the smallest value) that are designated at the side of the capacitors C131 to C133 of FIG. 4, m=C133/C132=30, so that the output voltage Vda can be expressed by Vda=VM+VL/32.

This indicates that ten-bit DA conversion can be achieved in such a manner that a ten-bit input digital code is segmented into two five-bit codes, the segmented codes are respectively converted into analog signals through the first and second DAC units 110 and 120, and the converted results are processed through the divide-add circuit 130.

FIGS. 5 is a circuit diagram showing a high-resolution DAC according to another embodiment of the present invention. The second embodiment achieves ten-bit DA conversion in such a manner that a ten-bit input digital code is segmented into one two-bit code and two four-bit codes, the segmented codes are respectively converted into analog signals through DACs, each of which is the same as that of FIG. 1, and the converted results are processed through the divide-add circuit of FIG. 3.

As shown in FIG. 5, the high-resolution DAC according to another embodiment-of the present invention includes first-to-third DAC units 210, 220 and 230 for respectively performing DA conversion on two bits corresponding to the LSB of an input digital code, four bits, and four bits corresponding to the MSB of the input digital code, and outputting analog voltages, corresponding to respective input digital codes, based on an input voltage Vref, a first divide-add circuit unit 240 for adding the outputs of the first and second DAC units 210 and 220, and a second divide-add circuit unit 250 for adding the addition output of the DA conversion outputs of the first and second DAC units 210 and 220, which is obtained by the first divide-add circuit unit 240, and the DA conversion output of the third DAC unit 230.

Since the construction of each of the first-to-third DACs 210, 220 and 230 is the same as the DAC of FIG. 1 and the construction of each of the first and second divide-add circuit units 240 and 250 is the same as the divide-add circuit of FIG. 3, descriptions of the detailed constructions of these components and the same operation as shown in FIG. 4 are omitted.

Furthermore, the switch S241 of the first divide-add circuit unit 240, which is an additional component compared to the construction of FIG. 4, is turned off when the DA conversion of the second DAC 220 is performed, and is turned on when the division-addition operation of the first divide-add circuit unit 240 is performed, so that the DA conversion operation and the division-addition operation can be separated from each other.

In the above-described second embodiment of the present invention, only an operation of adding the added output of the second DAC units 210 and 220 through the divide-add circuit unit 240, and the output of the third DAC unit 230, is described below.

When the conversion output of the first DAC unit 210 is defined as VN and the conversion output of the second DAC 220 is defined as VL, a first output voltage Vda1, that is, the addition result of the first and second DAC units 210 and 220, which is obtained by the first divide-add circuit unit 240, can be expressed by Vda1=VL+VN/(m+2), similar to Equation 1.

In this case, when C241=C243=m*C242, m=14/1=-14 because, in FIG. 5, the value of the capacitor C242 is 1 and the value of the capacitor C243 is 14. Consequently, a first output voltage Vda1, that is, the addition result of the first and second DAC units 210 and 220 can be expressed as the following Equation 3:

$$VL+VN/16 \quad (3)$$

Thereafter, the second divide-add circuit unit 250 adds the first output voltage Vda1 of the first divide-add circuit unit 240 and the conversion output of the third DAC 230, thus finally outputting a second output voltage Vda2.

That is, when the conversion output of the third DAC unit 230 is defined as VM, the second output voltage Vda2 can be expressed by Vda2=VM+Vda1/(m+2).

In this case, when C251=C253=m*C252, m=14/1=14 because, in FIG. 5, the value of the capacitor C252 is 1 and the value of the capacitor C253 is 14. Consequently, the second output voltage Vda2 can be expressed as the following Equation 4:

$$VM+Vda1/16=VM+(VL+VN/16)/16=VM+VL/16+VN/256 \quad (4)$$

This indicates that a final output with respect to a ten bit input digital code can be obtained in such a manner as to segment the input digital code of a ten-bit DAC, respectively having two bits, four bits and four bits, obtain analog voltages. VN; VL and VM, which correspond to input digital codes, through the first-to-third DAC units 210, 220 and 230 based on an input voltage Vref, obtain the addition result Vda1 of the conversion outputs of the first and second DAC units 210 and 220 through the first divide-add circuit unit 240, and add the addition result Vda1 and the conversion output VM of the third DAC 230.

FIG. 6 is a circuit diagram showing a high-resolution DAC according to a further embodiment of the present invention FIG. 6. The third embodiment achieves twelve-bit DA conversion in such a manner that a twelve-bit input digital code is segmented into three four-bit codes, the segmented codes are respectively converted into analog signals through DACs, each of which is the same as that of FIG. 1, and the converted results are also processed through the divide-add circuit of FIG. 3.

As shown in FIG. 6, the high-resolution DAC according to the third embodiment of the present invention includes first-to-third DAC units 310, 320 and 330 for performing DA conversion on four bits corresponding to the LSB of an input digital code, four bits, and four bits corresponding to the MSB of the input digital code DA, and outputting analog voltages corresponding to respective input digital codes based on an input voltage Vref, a first divide-add circuit unit 340 for adding the first and second DAC units 310 and 320, and a second divide-add circuit unit 350 for adding a addition result of the DA conversion outputs of the first and second, DAC unit 310 and 320, which is obtained by the first divide-add circuit unit 340, and the DA conversion output of the third DAC unit 330.

Since the construction and operation of the third embodiment of the present invention are the same of those of FIG. 5, except that the LSB is four bits compared to the second embodiment of FIG. 5, detailed descriptions of the construction and operation are omitted.

In the implementation of a high-resolution DAC, the present invention described above is configured such that an input digital code is segmented into two or more small-bit codes, the segmented codes are converted through corresponding DACs, a total DAC output is generated using the outputs of the DACs. Although the present invention is exemplified by an, algorithmic DAC, all types of DACs, each of which generates an output by the voltages of capacitors, can be employed.

Furthermore, although the cases where ten-bit and twelve-bit input digital codes are segmented into two or more codes, each having four or five bits, has been described, it must be appreciated that the segmented codes, each having any number of bits, can be implemented.

As described above, the present invention allows a high-resolution DAC, the input digital code of which is segmented into two or more small-bit codes, to be easily implemented using a simple divide-add circuit that is composed only of capacitors and switches.

Furthermore, the implementation of the present invention is more simplified in the case where the output of each segment DAC is generated by the voltages of capacitors, and the present invention can be usefully applied in the case where the total area of a DAC must be small and the power consumption thereof must be low.

Although the preferred embodiments of the present invention have been disclosed for illustrative purposes, those skilled in the art will appreciate that various modifications, accumulations and substitutions are possible, without departing from the scope and spirit of the invention as disclosed in the accompanying claims.

What is claimed is:
1. A divide-add circuit, comprising:
a first capacitor configured to store charges depending on a first voltage across the first capacitor;
a third capacitor configured to store charges depending on a second voltage across the third capacitor;
a first path control switch connected to the third capacitor, and configured such that the first and third capacitors are connected in series to each other therethrough; and
a second capacitor connected in parallel to the first capacitor with respect to the first voltage, and configured to be connected in series to the third capacitor though the first path control switch;
wherein a value of voltage, which is obtained by dividing the second voltage at an appropriate ratio that is proportional to a ratio of the second and third capacitors, is added to the first voltage, prior to connection between the second and third capacitors; and
wherein a value of the first voltage across the first capacitor is calculated by a division and addition operation in a state in which the second capacitor is connected in series to the third capacitor through the first path control switch and the first and third capacitors are connected in parallel to each other.

2. The divide-add circuit as set forth in claim 1, wherein the second capacitor is connected with a second path control switch that is turned off when the first path control switch is turned on, thereby allowing the second capacitor and the third capacitor to be connected in series to each other.

3. The divide-add circuit as set forth in claim 1, wherein the first and third capacitors have identical capacitance, and capacitance of the second capacitor is smaller than the capacitance of the first or third capacitor.

4. A high-resolution Digital-to-Analog Converter (DAC) using a divide-add circuit, comprising:
   a plurality of DAC units for performing Digital-Analog (DA) conversion on two or more segmented codes, into which an input digital code is segmented; and
   at least one divide-add circuit unit to generate a final DA conversion output for the entire input digital code based on the voltages of the DAC units, each of said at least one divide-add circuit units consisting of capacitors and switches.

5. The high-resolution DAC as set forth in claim 4, wherein each of the DAC units is a DAC unit that has an output corresponding to voltage of the capacitors.

6. The high-resolution DAC as set forth in claim 4, wherein the DAC units are connected in parallel to each other.

7. The high-resolution DAC as set forth in claim 4, wherein the DAC units are algorithmic DACs or cyclic DACs.

8. The high-resolution DAC as set forth in claim 4, wherein the at least one divide-add circuit units are a plurality of divide-add circuit units that adds conversion results of the DAC units that perform DA conversion on the segmented codes, ranging from a segmented code including a Least Significant Bit (LSB) of the input digital code to a segmented code including a Most Significant Bit (MSB) of the input digital code, and obtains a DA conversion result of the entire input digital code.

9. The high-resolution DAC as set forth in claim 8, wherein each of the at least one divide-add circuit units comprises:
   a first capacitor configured to store charges depending on a first voltage across the first capacitor;
   a third capacitor configured to store charges depending on a second voltage across the third capacitor;
   a first path control switch connected to the third capacitor, and configured such that the first and third capacitors are connected in series to each other therethrough; and
   a second capacitor connected in parallel to the first capacitor with respect to the first voltage, and configured to be connected in series to the third capacitor though the first path control switch;
   wherein a value of voltage, which is obtained by dividing the second voltage at an appropriate ratio that is proportional to a ratio of the second and third capacitors, is added to the first voltage, prior to connection between the second and third capacitors; and
   wherein a value of the first voltage across the first capacitor is calculated by a division and addition operation in a state in which the second capacitor is connected in series to the third capacitor through the first path control switch and the first and third capacitors are connected in parallel to each other.

10. The high-resolution DAC as set forth in claim 9, wherein the second capacitor is connected with a second path control switch that is turned off when the first path control switch is turned on, thereby allowing the second capacitor and the third capacitor to be connected in series to each other.

11. The high-resolution DAC as set forth in claim 9, wherein the first and third capacitors have identical capacitance, and capacitance of the second capacitor is smaller than the capacitance of the first or third capacitor.

12. A high-resolution Digital-to-Analog Converter (DAC) using a divide-add circuit, comprising:
   a plurality of DAC units for performing Digital-Analog (DA) conversion on two or more segmented codes, into which an input digital code is segmented; and
   one or more divide-add circuit units configured to be each composed only of capacitors and switches and to generate a final DA conversion output for the entire input digital code based on the voltages of the DAC units,
   wherein the one or more divide-add circuit units are a plurality of divide-add circuit units that adds conversion results of the DAC units that perform DA conversion on the segmented codes, ranging from a segmented code including a Least Significant Bit (LSB) of the input digital code to a segmented code including a Most Significant Bit (MSB) of the input digital code, and obtains a DA conversion result of the entire input digital code.

13. The high-resolution DAC as set forth in claim 12, wherein each of the DAC units is a DAC unit that has an output corresponding to voltage of the capacitors.

14. The high-resolution DAC as set forth in claim 12, wherein the DAC units are connected in parallel to each other.

15. The high-resolution DAC as set forth in claim 12, wherein the DAC units are algorithmic DACs or cyclic DACs.

16. The high-resolution DAC as set forth in claim 12, wherein each of the one or more divide-add circuit units comprises:
   a first capacitor configured to store charges depending on a first voltage across the first capacitor;
   a third capacitor configured to store charges depending on a second voltage across the third capacitor;
   a first path control switch connected to the third capacitor, and configured such that the first and third capacitors are connected in series to each other therethrough; and
   a second capacitor connected in parallel to the first capacitor with respect to the first voltage, and configured to be connected in series to the third capacitor though the first path control switch;
   wherein a value of voltage, which is obtained by dividing the second voltage at an appropriate ratio that is proportional to a ratio of the second and third capacitors, is added to the first voltage, prior to connection between the second and third capacitors; and
   wherein a value of the first voltage across the first capacitor is calculated by a division and addition operation in a state in which the second capacitor is connected in series to the third capacitor through the first path control switch and the first and third capacitors are connected in parallel to each other.

17. The high-resolution DAC as set forth in claim 12, wherein the second capacitor is connected with a second path control switch that is turned off when the first path control switch is turned on, thereby allowing the second capacitor and the third capacitor to be connected in series to each other.

18. The high-resolution DAC as set forth in claim 12, wherein the first and third capacitors have identical capacitance, and capacitance of the second capacitor is smaller than the capacitance of the first or third capacitor.

19. The high-resolution DAC as set forth in claim 12, further comprising a control unit for segmenting the input digital code into a plurality codes.

* * * * *

UNITED STATES PATENT AND TRADEMARK OFFICE
CERTIFICATE OF CORRECTION

| | | |
|---|---|---|
| PATENT NO. | : 7,283,077 B2 | Page 1 of 1 |
| APPLICATION NO. | : 11/398868 | |
| DATED | : October 16, 2007 | |
| INVENTOR(S) | : Gyu-Hyeong Cho et al. | |

It is certified that error appears in the above-identified patent and that said Letters Patent is hereby corrected as shown below:

In column 8, claim 1, line 56 "though" should read --through--.

In column 9, claim 9, line 52 "though" should read --through--.

In column 10, claim 16, line 50 "though" should read --through--.

Signed and Sealed this

Twenty-ninth Day of April, 2008

JON W. DUDAS
*Director of the United States Patent and Trademark Office*